(12) United States Patent
Kyushima et al.

(10) Patent No.: US 9,369,643 B2
(45) Date of Patent: Jun. 14, 2016

(54) SOLID-STATE IMAGING DEVICE

(75) Inventors: Ryuji Kyushima, Hamamatsu (JP); Kazuki Fujita, Hamamatsu (JP); Harumichi Mori, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 94 days.

(21) Appl. No.: 13/979,504

(22) PCT Filed: Dec. 7, 2011

(86) PCT No.: PCT/JP2011/078324
§ 371 (c)(1),
(2), (4) Date: Jul. 12, 2013

(87) PCT Pub. No.: WO2012/098777
PCT Pub. Date: Jul. 26, 2012

(65) Prior Publication Data
US 2013/0284892 A1 Oct. 31, 2013

(30) Foreign Application Priority Data
Jan. 17, 2011 (JP) ................................. 2011-006945

(51) Int. Cl.
*H04N 5/347* (2011.01)
*H01L 27/146* (2006.01)
*H04N 5/343* (2011.01)
*H04N 5/374* (2011.01)
*H04N 5/378* (2011.01)

(52) U.S. Cl.
CPC .......... *H04N 5/347* (2013.01); *H01L 27/14645* (2013.01); *H01L 27/14658* (2013.01); *H04N 5/343* (2013.01); *H04N 5/378* (2013.01); *H04N 5/3742* (2013.01)

(58) Field of Classification Search
CPC ....... H04N 5/347; H04N 5/343; H04N 5/378; H04N 5/3742; H04N 5/376; H01L 27/146; H01L 27/14658; H01L 27/14645
See application file for complete search history.

(56) References Cited

U.S. PATENT DOCUMENTS 4,774,586 A * 9/1988 Koike et al. .................... 348/323
4,866,292 A * 9/1989 Takemoto et al. ............. 348/296

(Continued)

FOREIGN PATENT DOCUMENTS

JP 10-275906 A 10/1998
JP 11-308531 A 11/1999

(Continued)

*Primary Examiner* — John Lee
(74) *Attorney, Agent, or Firm* — Drinker Biddle & Reath LLP

(57) ABSTRACT

A vertical shift register section includes M logic circuits for outputting row selection control signals respectively to M row selection wiring lines and shift register circuits disposed for every two row selection wiring lines. The M logic circuits, when a binning control signal $Vbin_1$ or $Vbin_2$ and an output signal of the shift register circuit both have significant values, output a row selection control signal Vsel so as to close a readout switch. The vertical shift register section, by controlling the timing at which the binning control signals $Vbin_1$ and $Vbin_2$ take significant values, realizes a normal operation mode for successively selecting the two row selection wiring lines and a binning operation mode for simultaneously selecting the two row selection wiring lines. Accordingly, a vertical binning operation is realized by a small vertical shift register.

4 Claims, 9 Drawing Sheets

(56) References Cited

U.S. PATENT DOCUMENTS

| | | | |
|---|---|---|---|
| 5,070,380 A * | 12/1991 | Erhardt et al. | 257/222 |
| 5,119,202 A * | 6/1992 | Hashimoto et al. | 348/302 |
| 5,210,049 A * | 5/1993 | Anagnostopoulos | 438/60 |
| 5,286,988 A * | 2/1994 | Nishi | 257/223 |
| 5,289,022 A * | 2/1994 | Iizuka et al. | 257/232 |
| 5,338,946 A * | 8/1994 | Guidash | 257/223 |
| 5,420,631 A * | 5/1995 | Hamasaki | 348/229.1 |
| 5,471,246 A * | 11/1995 | Nishima et al. | 348/322 |
| 5,504,527 A * | 4/1996 | Philbrick et al. | 348/313 |
| 5,537,146 A * | 7/1996 | Tohyama | 348/311 |
| 5,793,423 A * | 8/1998 | Hamasaki | 348/302 |
| 5,808,677 A * | 9/1998 | Yonemoto | 348/308 |
| 5,818,526 A * | 10/1998 | Nomoto | 348/302 |
| 6,198,507 B1 * | 3/2001 | Ishigami | 348/273 |
| 6,330,303 B1 * | 12/2001 | Yamane et al. | 378/98.8 |
| 6,512,545 B1 * | 1/2003 | Mizoguchi et al. | 348/304 |
| 6,630,303 B1 | 10/2003 | Benton et al. | |
| 6,963,372 B1 * | 11/2005 | Hiyama et al. | 348/302 |
| 7,053,943 B2 * | 5/2006 | Kakumoto et al. | 348/260 |
| 7,119,341 B2 * | 10/2006 | Petrick | 250/370.09 |
| 7,193,601 B2 * | 3/2007 | Furuya | 345/100 |
| 7,474,346 B2 * | 1/2009 | Kanai | 348/304 |
| 7,532,148 B2 * | 5/2009 | Muramatsu et al. | 341/169 |
| 7,566,878 B2 * | 7/2009 | Iwakiri | 250/370.09 |
| 7,573,037 B1 * | 8/2009 | Kameshima et al. | 250/370.09 |
| 7,679,665 B2 * | 3/2010 | Egawa et al. | 348/305 |
| 7,746,399 B2 * | 6/2010 | Itoh et al. | 348/302 |
| 8,189,082 B2 * | 5/2012 | Matsuura | 348/294 |
| 8,421,889 B2 * | 4/2013 | Hiyama et al. | 348/272 |
| 8,483,359 B2 * | 7/2013 | Fujita et al. | 378/98.8 |
| 2005/0121616 A1 * | 6/2005 | Petrick | 250/370.09 |
| 2007/0139544 A1 * | 6/2007 | Egawa et al. | 348/308 |
| 2009/0218476 A1 * | 9/2009 | Kameshima et al. | 250/208.1 |
| 2010/0134670 A1 | 6/2010 | Egawa et al. | |
| 2013/0284892 A1 * | 10/2013 | Kyushima et al. | 250/208.1 |
| 2013/0292549 A1 * | 11/2013 | Fujita et al. | 250/208.1 |
| 2013/0308030 A1 * | 11/2013 | Fujita et al. | 348/302 |

FOREIGN PATENT DOCUMENTS

| | | |
|---|---|---|
| JP | 2000-165747 A | 6/2000 |
| JP | 2001-189891 A | 7/2001 |
| JP | 2005-223890 A | 8/2005 |
| JP | 2007-050053 A | 3/2007 |
| JP | 2007-173950 A | 7/2007 |

* cited by examiner

SOLID-STATE IMAGING DEVICE

TECHNICAL FIELD

The present invention relates to a solid-state imaging device.

BACKGROUND ART

Patent Document 1 describes a device for which optical sensors are arrayed in the row direction and column direction. The device described in this document includes a shift register array that supplies vertical scanning signals, switches for connecting neighboring vertical signal wiring lines to each other, and a shift register array that controls the opening and closing of the switches, and enables a vertical binning operation by closing the above-mentioned switch.

CITATION LIST

Patent Literature

Patent Document 1: Japanese Patent Application Laid-Open No. 2001-189891

SUMMARY OF INVENTION

Technical Problem

In recent years, for example, for solid-state imaging elements such as two-dimensional flat panel image sensors to be used for medical purposes (such as dental radiography), wider photodetecting surfaces have been demanded. However, if photodetecting sections (photodiode arrays) are fabricated on monocrystalline silicon wafers as in prior solid-state imaging elements, the extent of photodetecting surfaces of the solid-state imaging elements is limited due to the size of the monocrystalline silicon wafers that are at most 12 inches in diameter. Therefore, the present inventors have studied, for example, a technique of forming a film of polycrystalline silicon on an insulating substrate such as a glass substrate, and forming photodiodes and other electronic components such as transistors on the surface of the polycrystalline silicon. Providing solid-state imaging elements with such structures enables making the photodetecting surfaces remarkably wide as compared with those of conventional solid-state imaging elements formed with use of monocrystalline silicon wafers.

Meanwhile, for a solid-state imaging element, it is sometimes desired to output data of a plurality of adjacent pixels collectively, a so-called binning operation. For example, when the solid-state imaging element is used for medical purposes, performing a binning operation enables quickly identifying a region that is desired to be observed, observation through a moving image, and the like. Also, binning methods include a method of collectively reading out charges from a plurality of adjacent pixels and a method of generating digital data of each pixel by a normal operation, and then adding and outputting the digital data of a plurality of adjacent pixels. Of these, the method of collectively reading out charges from a plurality of pixels is preferable because this allows making the frame rate faster than that by the method of adding and outputting the digital data of a plurality of pixels.

However, when charges from a plurality of adjacent pixels are collectively read out, if a vertical shift register that is used for a normal operation is added with a circuit for making the same correspond to a vertical binning operation, the vertical shift register is increased in size. In particular, when vertical shift registers are formed on the surface of polycrystalline silicon film-formed on an insulating substrate, it is difficult to use such a microfabrication process as used when forming the same on a monocrystalline silicon wafer, and the only outcome is a relatively low degree of integration. Accordingly, as a result of the addition of a circuit for vertical binning as described above, the increase in size of the vertical shift register becomes more remarkable.

It is therefore an object of the present invention to provide a solid-state imaging device which allows realizing a vertical binning operation by a small vertical shift register.

Solution to Problem

In order to solve the above-described problem, a solid-state imaging device according to the present invention includes a photodetecting section having M×N (M is an even number not less than 2, N is an integer not less than 2) pixels each including a photodiode and a readout switch connected at one end to the photodiode that are arrayed two-dimensionally in M rows and N columns, M row selection wiring lines arranged for each row, and connected to control terminals of the readout switches included in the pixels of corresponding rows, and a vertical shift register section for providing row selection control signals for controlling opening and closing of the readout switches to the M row selection wiring lines, the vertical shift register section includes a shift register array including M/2 shift register circuits formed of a semiconductor material containing polycrystalline silicon, and disposed for every two row selection wiring lines, M logic circuits for outputting the row selection control signals respectively to the M row selection wiring lines, a first binning selection wiring line for providing one-side input terminals of M/2 logic circuits connected to one of each two row selection wiring lines with a first binning control signal for selecting the one row selection wiring line, and a second binning selection wiring line for providing one-side input terminals of M/2 logic circuits connected to the other of each two row selection wiring lines with a second binning control signal for selecting the other row selection wiring line, and in the device, to the-other-side input terminal of each of the M logic circuits, an output terminal of the shift register circuit corresponding to the row selection wiring line connected to the logic circuit is connected, each of the M logic circuits, when the first binning control signal or the second binning control signal and an output signal from the shift register circuit both have significant values, outputs the row selection control signal so as to close the readout switch, and the vertical shift register section has a normal operation mode for successively selecting the two row selection wiring lines and a binning operation mode for simultaneously selecting the two row selection wiring lines, by controlling the timings at which the first binning control signal and the second binning control signal take significant values.

This solid-state imaging device can operate, for example, as follows. First, in the normal operation mode, one input terminal of a logic circuit connected to one of the first two row selection wiring lines is provided with a significant value of a first binning control signal. Simultaneously, to the other input terminal of the logic circuit, a significant value of an output signal from the first-stage shift register circuit is provided. Accordingly, the readout switches of the respective pixels of the first row close due to a row selection control signal output from the logic circuit, so that charges are output from the photodiodes of the respective pixels of the first row. Next, the significant value of the output signal from the first-stage shift register circuit is maintained, while one input terminal of a logic circuit connected to the other of the first two row selection wiring lines is provided with a significant value of a second binning control signal. Accordingly, the readout switches of the respective pixels of the second row close due to a row selection control signal output from the logic circuit, so that charges are output from the photodiodes of the respective pixels of the second row. Subsequently, the same operation is performed also for the next two row selection wiring lines, and thereafter, the same operation is performed until the M-th row.

On the other hand, in the binning operation mode, one input terminal of a logic circuit connected to one of the first two row selection wiring lines is provided with a significant value of a first binning control signal. Simultaneously, one input terminal of a logic circuit connected to the other of the two row selection wiring lines is provided with a significant value of a second binning control signal. Moreover, simultaneously with these operations, to the-other-side input terminals of the logic circuits, a significant value of an output signal from the first-stage shift register circuit is provided. Accordingly, the readout switches of the respective pixels of the first row and the second row close due to row selection control signals output from the two logic circuits connected to the two row selection wiring lines, so that charges are collectively output from the photodiodes of the respective pixels of the first row and the second row.

Thus, by the solid-state imaging device described above, both the normal operation and vertical binning operation can be favorably realized. Moreover, because the shift register circuits of the vertical shift register section are provided for every two row selection wiring lines, the vertical shift register section can be made smaller than that of a conventional solid-state imaging device for which shift register circuits are disposed for each row. Particularly, when the shift register circuits are formed of a semiconductor material containing polycrystalline silicon as in the solid-state imaging device of the present invention, such an effect is more remarkable.

Advantageous Effects of Invention

The solid-state imaging device by the present invention allows realizing a vertical binning operation by a small vertical shift register.

DESCRIPTION OF EMBODIMENTS

Hereinafter, embodiments of a solid-state imaging device according to the present invention will be described in detail with reference to the accompanying drawings. Also, the same components will be denoted with the same reference symbols in the description of the drawings, and overlapping description will be omitted.

Figure 1:
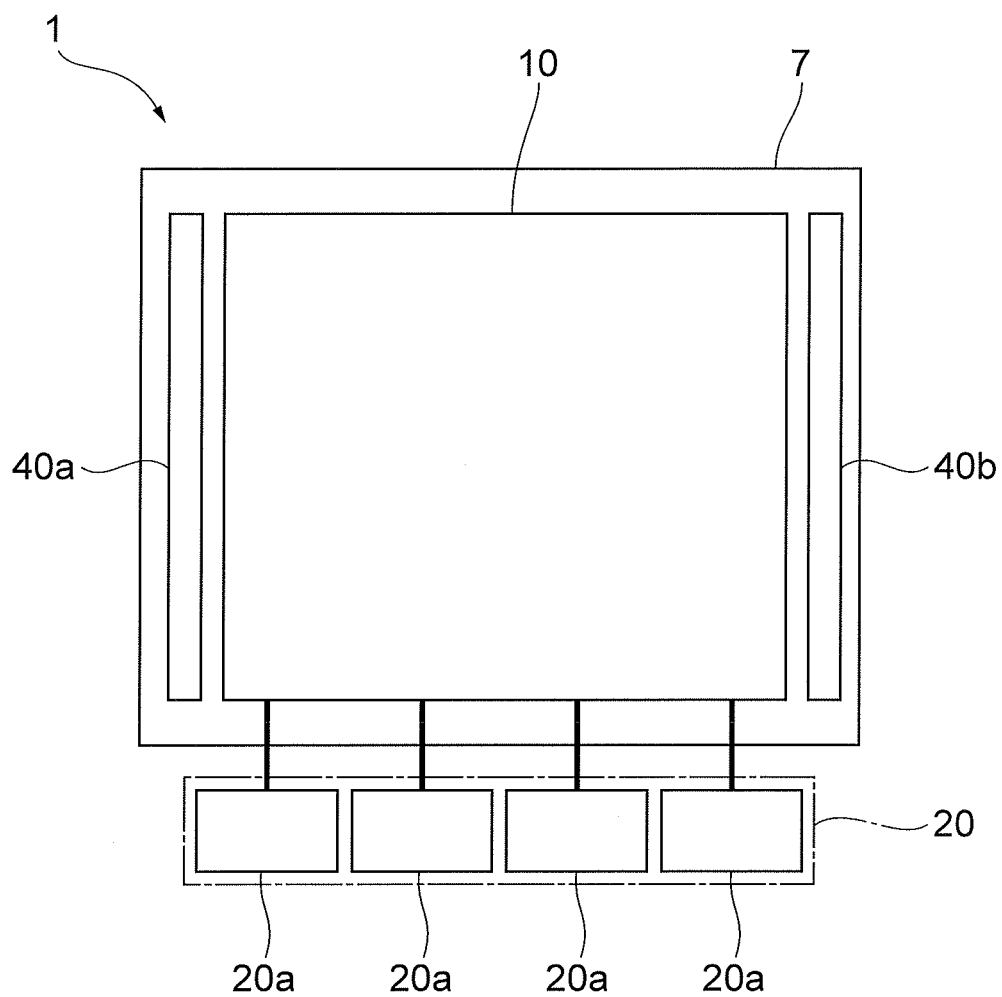
FIG. 1 is a plan view showing a solid-state imaging device according to an embodiment.
Figure 2:
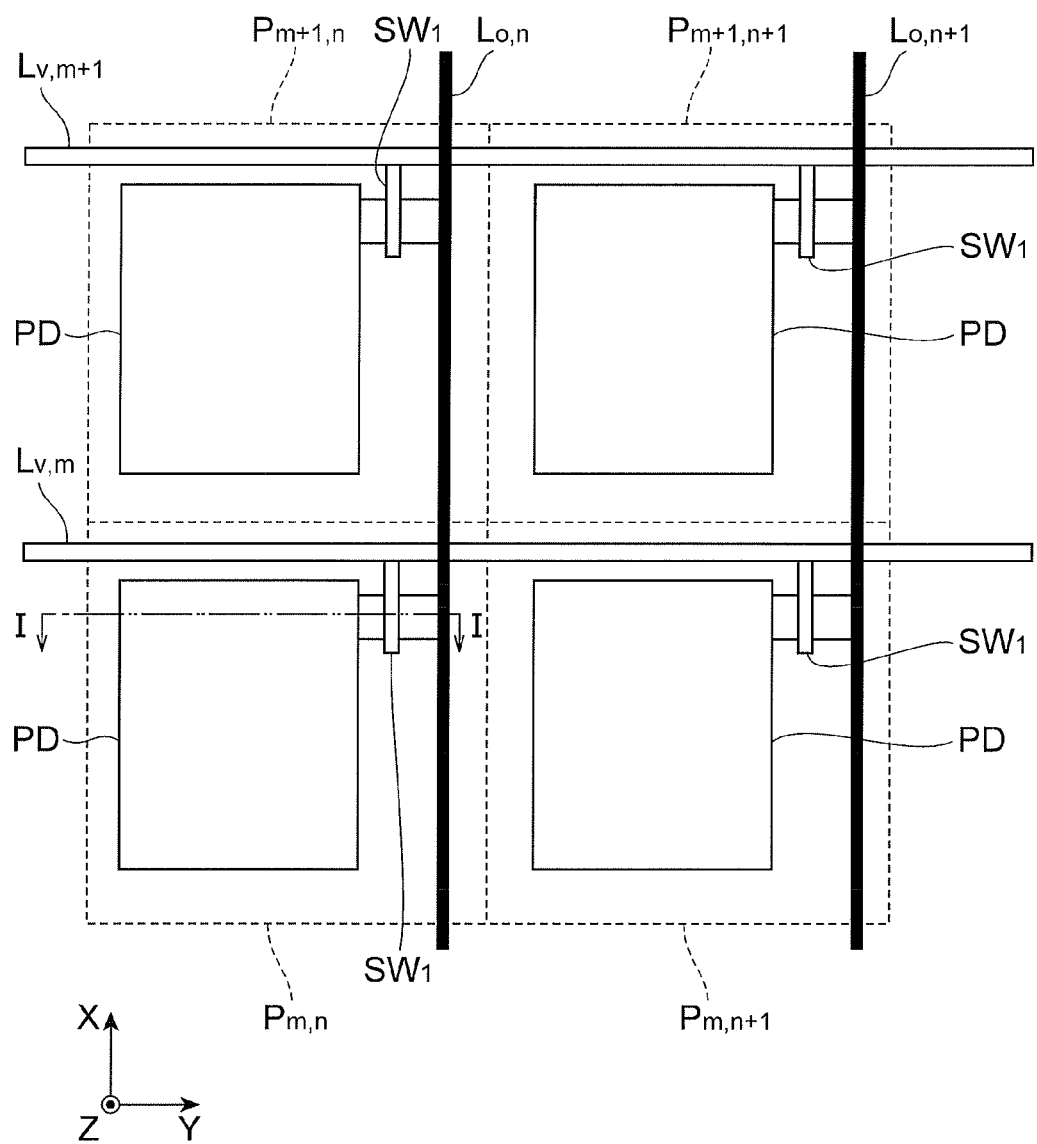
FIG. 2 is a partially enlarged plan view of the solid-state imaging device.
Figure 3:
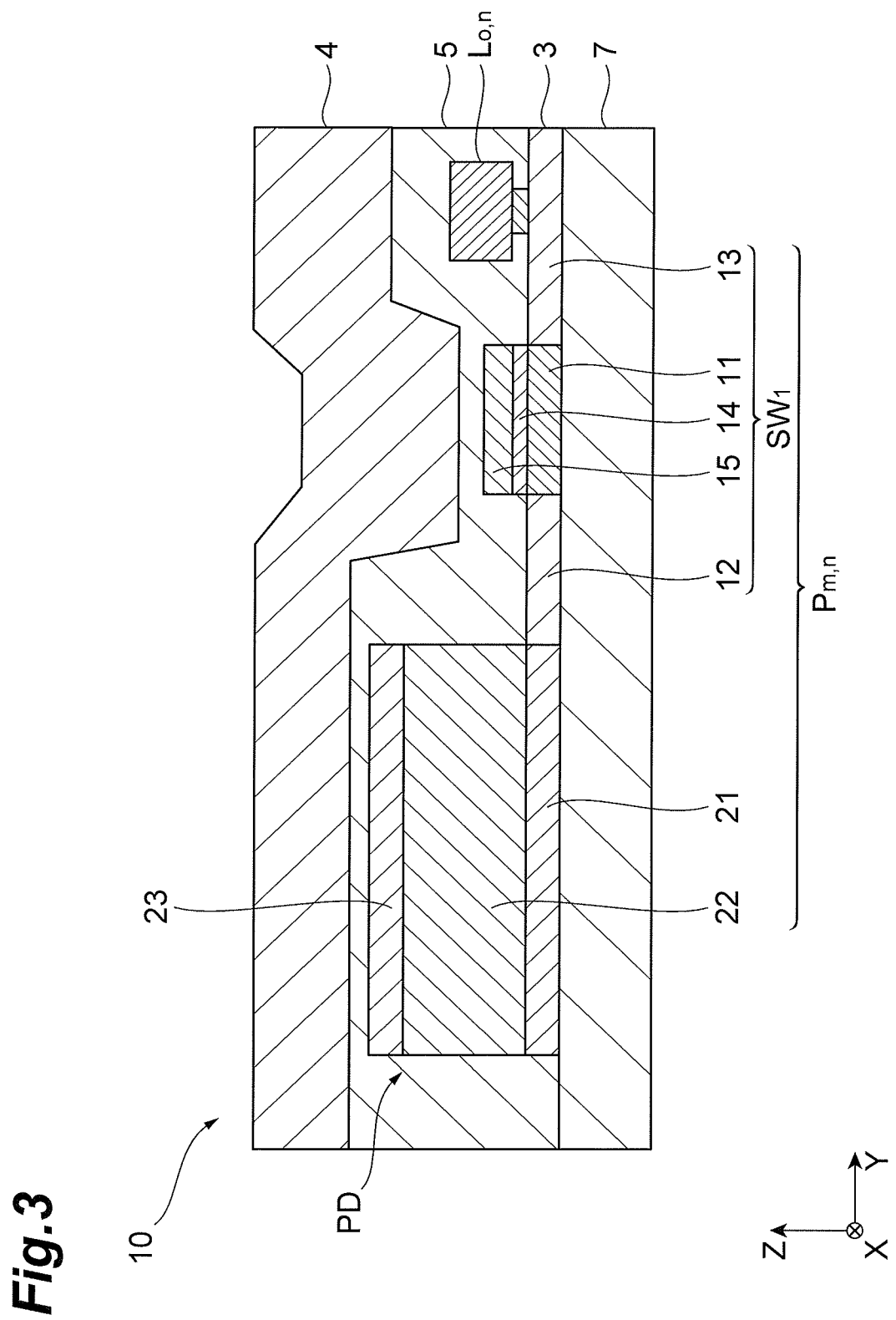
FIG. 3 is a side sectional view showing a section taken along a line I-I of FIG. 2.

The solid-state imaging device according to the present embodiment is used for, for example, a medical X-ray imaging system, and used particularly for a system for taking X-ray images of the jaw of a subject being tested by imaging modes such as panoramic radiography, cephalography, and CT in dentistry medical treatment. Therefore, the solid-state imaging device of the present embodiment includes thin-film transistors formed by polycrystalline silicon deposited on a large-area glass substrate and photodiodes formed by amorphous silicon deposited thereon, and has a remarkably wide photodetecting area as compared with that of a conventional solid-state imaging device prepared from a monocrystalline silicon wafer. FIG. 1 to FIG. 3 are views showing a configuration of the solid-state imaging device 1 of the present embodiment. FIG. 1 is a plan view showing the solid-state imaging device 1, and FIG. 2 is a partially enlarged plan view of the solid-state imaging device 1. Further, FIG. 3 is a side sectional view showing a section taken along a line I-I of FIG. 2. Also, in FIG. 1 to FIG. 3, an XYZ orthogonal coordinate system is also shown for easy understanding.

As shown in FIG. 1, the solid-state imaging device 1 includes a glass substrate 7, a photodetecting section 10 fabricated on a principal surface of the glass substrate 7, a vertical shift register section 40a (first vertical shift register section), and a vertical shift register section 40b (second vertical shift register section). Moreover, the solid-state imaging device 1 includes a signal connecting section 20 disposed outside of the glass substrate 7. The signal connecting section 20 is composed of, for example, a plurality of C-MOS IC chips 20a electrically connected with the photodetecting section 10. The two vertical shift register sections 40a and 40b are respectively disposed on opposite sides of the photodetecting section 10. Also, the photodetecting section 10 and the vertical shift register sections 40a and 40b may be respectively provided on separate glass substrates 7. Further, the signal connecting section 20 may be provided on the glass substrate 7 with the photodetecting section 10 and the vertical shift register sections 40a and 40b.

The photodetecting section 10 is composed of M×N pixels two-dimensionally arrayed in M rows and N columns. The pixel $P_{m,n}$ shown in FIG. 2 is a pixel located on the m-th row and the n-th column. Here, m is an integer not less than 1 and not more than M, and n is an integer not less than 1 and not more than N. M and N are each an even number not less than 2. Also, in FIG. 2, the column direction is coincident with the X-axis direction, and the row direction is coincident with the Y-axis direction. Each of the plurality of pixels $P_{1,1}$ to $P_{M,N}$ included in the photodetecting section 10 includes a photodiode PD and a readout switch $SW_1$. One end (one current terminal) of the readout switch $SW_1$ is connected to the photodiode PD. Further, the other end (the other current terminal) of the readout switch $SW_1$ is connected to a corresponding readout wiring line (for example, in the case of the pixel $P_{m,n}$, an n-th column readout wiring line $L_{O,n}$). A control terminal of the readout switch $SW_1$ is connected to a corresponding row selection wiring line (for example, in the case of the pixel $P_{m,n}$, an m-th row selection wiring line $L_{V,m}$).

As shown in FIG. 3, over the entire surface on the glass substrate 7, a silicon film 3 is provided. The photodiode PD, the readout switch $SW_1$, and the n-th column readout wiring line $L_{O,n}$ are formed on the surface of the silicon film 3. The photodiode PD, the readout switch $SW_1$, and the n-th column readout wiring line $L_{O,n}$ are covered with an insulating layer 5, and on the insulating layer 5, a scintillator 4 is provided so as to cover the entire surface of the glass substrate 7. The photodiode PD is constructed containing, for example, amorphous silicon.

The photodiode PD of the present embodiment includes an n-type semiconductor layer 21 made of n-type polycrystalline silicon, an i-type semiconductor layer 22 made of i-type amorphous silicon provided on the n-type semiconductor layer 21, and a p-type semiconductor layer 23 made of p-type amorphous silicon provided on the i-type semiconductor layer 22. Moreover, the readout switch $SW_1$ is an FET formed of polycrystalline silicon, and includes a channel region 11, a source region 12 disposed along one side surface of the channel region 11, a drain region 13 disposed along the other side surface of the channel region 11, and a gate insulating film 14 and a gate electrode 15 formed on the channel region 11. The n-th column readout wiring line $L_{O,n}$ is made of metal. The scintillator 4 generates scintillation light in response to incident X-rays to convert an X-ray image into an optical image, and outputs the optical image to the photodetecting section 10.

The polycrystalline silicon that forms the readout switch $SW_1$ is more preferably low-temperature polycrystalline silicon. The low-temperature polycrystalline silicon is polycrystalline silicon that is formed at a process temperature of 100 to 600° C. Because the range of the process temperature of 100 to 600° C. is a temperature range where alkali-free glass can be used as a substrate, it becomes possible to produce a large-area photodetecting section 10 on a glass substrate. The alkali-free glass is, for example, sheet glass having a thickness of 0.3 to 1.2 mm, and used as so-called glass for substrates. The alkali-free glass contains little alkali, has a low coefficient of expansion and high heat resistance, and has stable characteristics. Moreover, the mobility of a low-temperature polycrystalline silicon-based device is 10 to 600 $cm^2/Vs$, and can be made greater than the mobility (0.3 to 1.0 $cm^2/Vs$) of amorphous silicon. That is, the on-resistance can be lowered.

The pixel $P_{m,n}$ as shown in FIG. 3 is produced, for example, by the following process. First, amorphous silicon is film-formed on the glass substrate 7. As the film forming method, for example, plasma CVD is favorable. Next, the amorphous silicon film is sequentially irradiated with laser beams by excimer laser annealing to make the entire surface of the amorphous silicon film into polycrystalline silicon. Thus, a silicon film 3 is formed. Then, after a $SiO_2$ film to serve as a gate insulating film 14 is formed on a partial region of the silicon film 3 being a polycrystalline silicon layer, a gate electrode 15 is formed thereon. Then, ions are implanted into regions to be the source region 12 and the drain region 13. Subsequently, by carrying out patterning of the silicon film 3, exposure and etching are repeatedly carried out to form other electrodes and contact holes, etc. Moreover, after ions are implanted into a region to be the pixel $P_{m,n}$ in the silicon film 3 so as to become n-type, i-type and p-type amorphous silicon layers (i.e. an i-type semiconductor layer 22 and a p-type semiconductor layer 23) are deposited thereon in order to form a PIN photodiode PD. Subsequently, a passivation film to serve as the insulating layer 5 is formed.

The signal connecting section 20 shown in FIG. 1 holds voltage values according to the amounts of charges output from the respective pixels $P_{1,1}$ to $P_{M,N}$ of the photodetecting section 10, and outputs the held voltage values successively row by row. The signal connecting section 20 of the present embodiment has a normal operation mode and a binning operation mode. In the normal operation mode, the signal connecting section converts charges sent from the pixels P of respective rows into voltage values on a one-row basis, and sequentially outputs these voltage values. Moreover, in the binning operation mode, the signal connecting section converts charges sent from the pixels P of respective rows into voltage values on a two-row basis, and sequentially outputs these voltage values.

Figure 4:
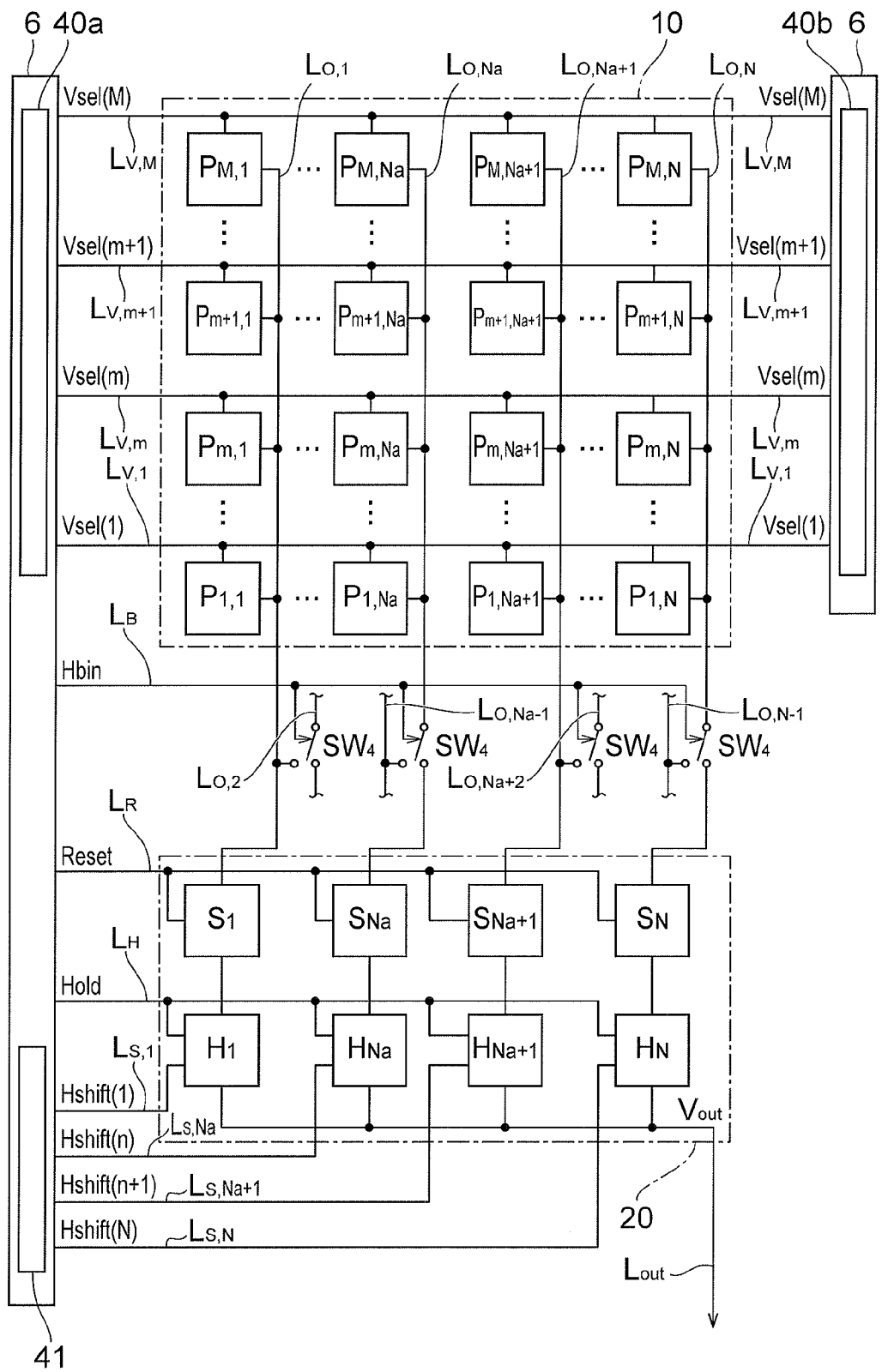
FIG. 4 is a diagram showing an internal configuration of the solid-state imaging device.

Next, a detailed configuration of the solid-state imaging device 1 according to the present embodiment will be described. FIG. 4 is a diagram showing an internal configuration of the solid-state imaging device 1. As in the above, the photodetecting section 10 consists of M×N pixels $P_{1,1}$ to $P_{M,N}$ arrayed two-dimensionally in M rows and N columns. Each of the M row selection wiring lines $L_{V,1}$ to $L_{V,M}$ is constructed by a single wiring line extending from the first column to the N-th column. The N pixels $P_{m,1}$ to $P_{m,N}$ of the m-th row are connected to the vertical shift register sections 40a and 40b via the m-th row selection wiring line $L_{V,m}$. Also, as shown in FIG. 4, the vertical shift register section 40a is connected to one end of the m-th row selection wiring line $L_{V,m}$, and the vertical shift register section 40b is connected to the other end of the m-th row selection wiring line $L_{V,m}$. The two vertical shift register sections 40a and 40b are both included in a controlling section 6.

The signal connecting section 20 includes N integration circuits $S_1$ to $S_N$ and N holding circuits $H_1$ to $H_N$ provided for each column. The integration circuits $S_1$ to $S_N$ and the holding circuits $H_1$ to $H_N$ are connected in series with each other for each column. The respective integration circuits $S_1$ to $S_N$ have a common configuration. Moreover, the respective holding circuits $H_1$ to $H_N$ have a common configuration.

Moreover, in the present embodiment, N/2 horizontal binning changeover switches $SW_4$ are provided for every two columns. An output terminal of each of the M pixels $P_{1,n}$ to $P_{M,n}$ contained in each of the odd-numbered columns is connected, via the n-th column readout wiring line $L_{O,n}$, to an input terminal of the integration circuit $S_n$ of the signal connecting section 20. Moreover, an output end of each of the M pixels $P_{1,n}$ to $P_{M,n}$ contained in each of the even-numbered columns is connected to an input terminal of the horizontal binning changeover switch $SW_4$. The horizontal binning changeover switch $SW_4$ has two output terminals, and one output terminal is connected to the integration circuit $S_n$ of the even-numbered column concerned, and the other output terminal is connected to the integration circuit $S_{n-1}$ of an adjacent odd-numbered column. Control terminals of the N/2 horizontal binning changeover switches $SW_4$ are connected to the controlling section 6 via a common binning changeover wiring line $L_B$.

The integration circuits $S_1$ to $S_N$ have input terminals connected to the column readout wiring lines $L_{O,1}$ to $L_{O,N}$, respectively, and accumulate charges input to the input terminals, and output voltage values according to the accumulated charge amounts from output terminals to the holding circuits $H_1$ to $H_N$. The integration circuits $S_1$ to $S_N$ are connected to the controlling section 6 via a common reset wiring line $L_R$. The holding circuits $H_1$ to $H_N$ have input terminals connected to the output terminals of the integration circuits $S_1$ to $S_N$, respectively, hold voltage values input to the input terminals, and output the held voltage values from output terminals to a voltage output wiring line $L_{out}$. The holding circuits $H_1$ to $H_N$ are connected to the controlling section 6 via a common hold wiring line $L_H$. Moreover, each of the holding circuits $H_1$ to $H_N$ is connected to a horizontal shift register section 41 of the controlling section 6 via each of the first column selection wiring line $L_{S,1}$ to the N-th column selection wiring line $L_{S,N}$.

The vertical shift register sections 40a and 40b of the controlling section 6 output an m-th row selection control signal Vsel(m) to the m-th row selection wiring line $L_{V,m}$ to provide this m-th row selection control signal Vsel(m) to each of the N pixels $P_{m,1}$ to $P_{m,N}$ of the m-th row. In each of the vertical shift register sections 40a and 40b, M row selection control signals Vsel(1) to Vsel(M) sequentially take significant values. Moreover, the horizontal shift register section 41 of the controlling section 6 outputs column selection control signals Hshift(1) to Hshift(N) to the column selection wiring lines $L_{S,1}$ to $L_{S,N}$ to provide these column selection control signals Hshift(1) to Hshift(N) to the holding circuits $H_1$ to $H_N$. The column selection control signals Hshift(1) to Hshift(N) also sequentially take significant values.

Moreover, the controlling section 6 outputs a reset control signal Reset to the reset wiring line $L_R$ to provide this reset control signal Reset to each of the N integration circuits $S_1$ to $S_N$. The controlling section 6 outputs a hold control signal Hold to the hold wiring line $L_H$ to provide this hold control signal Hold to each of the N holding circuits $H_1$ to $H_N$. The controlling section 6 outputs a horizontal binning control signal Hbin to the binning changeover wiring line $L_B$ to provide this horizontal binning control signal Hbin to each of the N/2 horizontal binning changeover switches $SW_4$.

Figure 5:
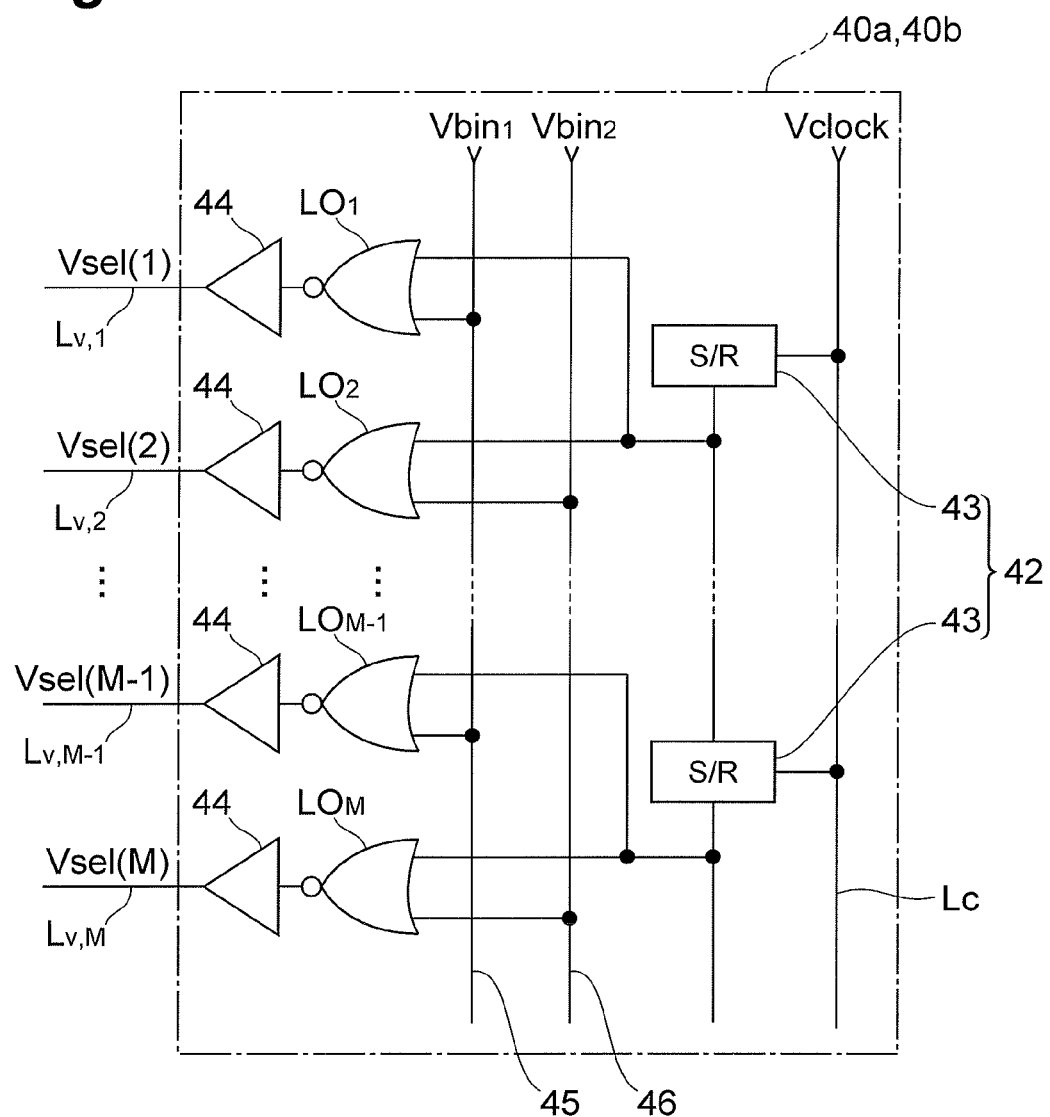
FIG. 5 is a circuit diagram showing a configuration of a vertical shift register section.

FIG. 5 is a circuit diagram showing a configuration of the vertical shift register sections 40a, 40b. As shown in FIG. 5, the vertical shift register section 40a, 40b of the present embodiment includes a shift register array 42, M logic circuits $LO_1$ to $LO_M$, a first binning selection wiring line 45, and a second binning selection wiring line 46.

The shift register array 42 is composed of M/2 shift register circuits 43 connected in series. These shift register circuits 43 are provided, for the M row selection wiring lines $L_{V,1}$ to $L_{V,M}$, one each for every two row selection wiring lines. In FIG. 5, one shift register circuit 43 is disposed corresponding to two row selection wiring lines $L_{V,1}$ and $L_{V,2}$, and one shift register circuit 43 is disposed corresponding to two row selection wiring lines $L_{V,M-1}$ to $L_{V,M}$. The shift register circuit 43 is composed of a plurality of FETs formed of a semiconductor material containing polycrystalline silicon, having the similar structure as that of the readout switch $SW_1$ shown in FIG. 3. Each shift register circuit 43 is connected with a clock wiring line $L_C$, and a clock signal Vclock with a given period is provided from the clock wiring line $L_C$ to each shift register circuit 43.

The first binning selection wiring line 45, when reading out charges from the respective pixels $P_{1,1}$ to $P_{M,N}$, provides a first binning control signal $Vbin_1$ to select one row selection wiring line $L_{V,1}, L_{V,3} \ldots, L_{V,M-1}$ of each two row selection wiring lines connected to each shift register circuit 43. The second binning selection wiring line 46, when reading out charges from the respective pixels $P_{1,1}$ to $P_{M,N}$, provides a second binning control signal $Vbin_2$ to select the other row selection wiring line $L_{V,2}, L_{V,4} \ldots, L_{V,M}$ of each two row selection wiring lines connected to each shift register circuit 43. The vertical shift register sections 40a and 40b, by controlling the timing of the first binning control signal $Vbin_1$ and the second binning control signal $Vbin_2$, realize a normal operation mode for successively selecting the two row selection wiring lines and a binning operation mode for simultaneously selecting the two row selection wiring lines. That is, in the normal operation mode, the first binning control signal $Vbin_1$ and the second binning control signal $Vbin_2$ successively take significant values. On the other hand, in the binning operation mode, the first binning control signal $Vbin_1$ and the second binning control signal $Vbin_2$ simultaneously take significant values.

The M logic circuits $LO_1$ to $LO_M$ correspond one-to-one to the M row selection wiring lines $L_{V,1}$ to $L_{V,M}$. An output terminal of each of the logic circuits $LO_1$ to $LO_M$ is connected, via a buffer 44 provided for each row, to each of the row selection wiring lines $L_{V,1}$ to $L_{V,M}$. Moreover, one-side input terminals of the respective logic circuits $LO_1$ to $LO_M$ are alternately connected to the first binning selection wiring line 45 and the second binning selection wiring line 46. That is, to one input terminal of the logic circuit $LO_m$ connected to one row selection wiring line $L_{V,m}$ of the two row selection wiring lines $L_{V,m}$ and $L_{V,m+1}$ corresponding to one shift register circuit 43, the first binning selection wiring line 45 is connected. On the other hand, to one input terminal of the logic circuit $LO_{m+1}$ connected to the other row selection wiring line $L_{V,m+1}$, the second binning selection wiring line 46 is connected. Thus, one-side input ends of M/2 logic circuits $LO_1, LO_3, \ldots, LO_{M-1}$ connected to one of each two row selection wiring lines corresponding to each shift register circuit 43 are connected with the first binning selection wiring line 45, and one-side input ends of the remaining M/2 logic circuits $LO_2, LO_4, \ldots, LO_M$ connected to the other are connected with the second binning selection wiring line 46.

To the other input terminal of each of the logic circuits $LO_1$ to $LO_M$, an output terminal of the shift register circuit 43 provided corresponding to a row selection wiring line to which the logic circuit concerned is connected is connected. Specifically, as shown in FIG. 5, to the-other-side input terminals of the logic circuits $LO_1$ and $LO_2$, the output terminal of the shift register circuit 43 provided corresponding to the row selection wiring lines $L_{V,1}$ and $L_{V,2}$ is connected. Further, to the-other-side input terminals of the logic circuits $LO_{M-1}$ and $LO_M$, the output terminal of the shift register circuit 43 provided corresponding to the row selection wiring lines $L_{V,M-1}$ and $L_{V,M}$ is connected.

Each of the M logic circuits $LO_1$ to $LO_M$, when the first binning control signal $Vbin_1$ or the second binning control signal $Vbin_2$ and an output signal from the shift register circuit 43 corresponding to the logic circuit concerned both have significant values, outputs each of the row selection control signals Vsel(1) to Vsel(M) so as to close the readout switch $SW_1$. For example, the significant values of the first binning control signal $Vbin_1$ and the second binning control signal $Vbin_2$ are low level and the significant value of an output signal from the shift register circuit 43 is low level, the M logic circuits $LO_1$ to $LO_M$ output negative OR (NOR) of the first binning control signal $Vbin_1$ or the second binning control signal $Vbin_2$ and the output signal from the shift register circuit 43. Although the logic circuits $LO_1$ to $LO_M$ are illustrated with the symbols standing for NOR circuits in FIG. 5, the logic circuits $LO_1$ to $LO_M$ may be constructed by combination of other various logic circuits.

Figure 6:
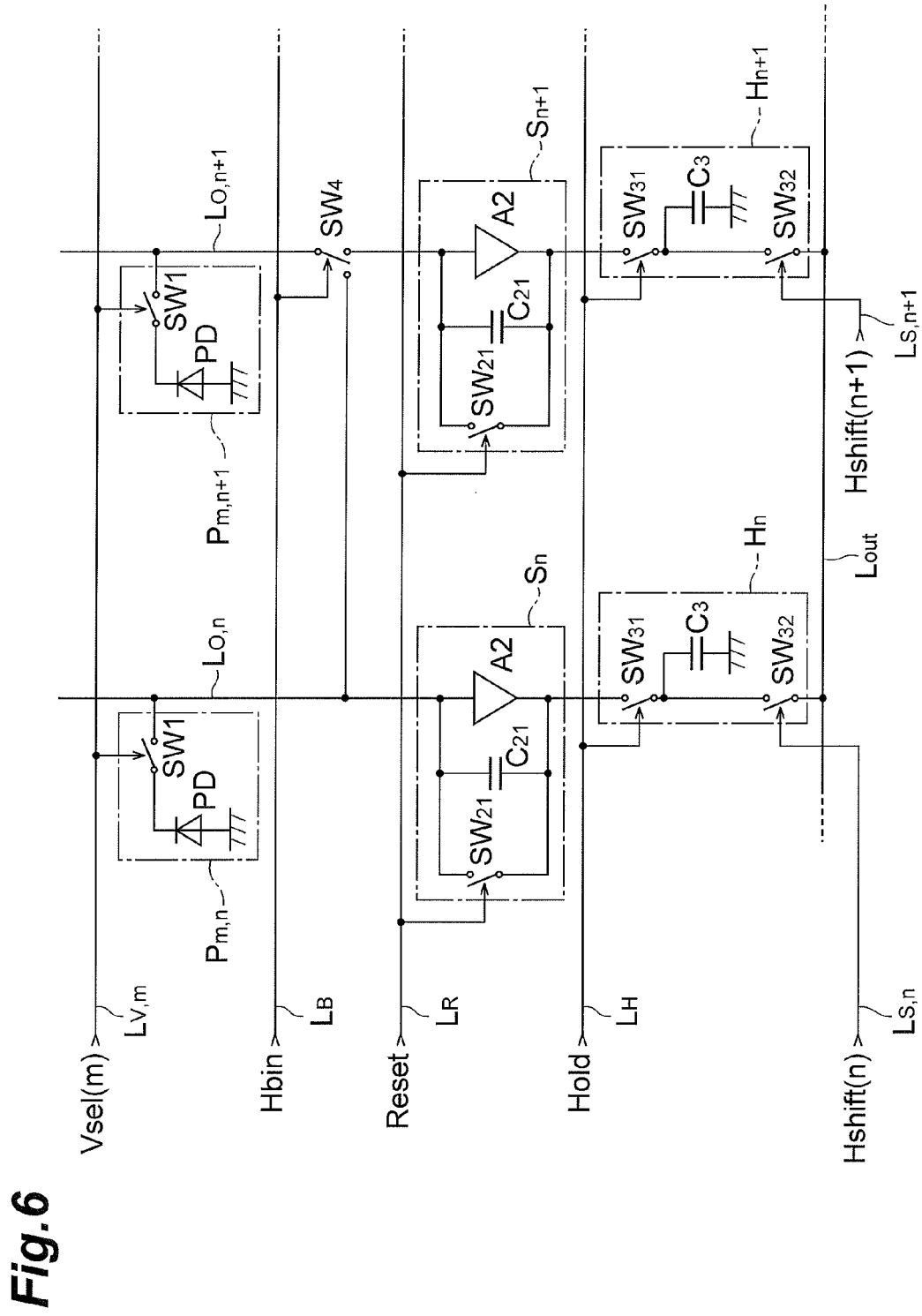
FIG. 6 is a diagram showing a circuit configuration of each of the pixels, integration circuits, and holding circuits of the solid-state imaging device.

FIG. 6 is a diagram showing a circuit configuration of each of the pixels $P_{m,n}$ and $P_{m,n+1}$, integration circuits $S_n$ and $S_{n+1}$, and holding circuits $H_n$ and $H_{n+1}$ of the solid-state imaging device 1. Here, circuit diagrams of the pixels $P_{m,n}$ and $P_{m,n+1}$ are shown as representatives of the M×N pixels $P_{1,1}$ to $P_{M,N}$, circuit diagrams of the integration circuits $S_n$ and $S_{n+1}$ are shown as representatives of the N integration circuits $S_1$ to $S_N$, and circuit diagrams of the holding circuits $H_n$ and $H_{n+1}$ are shown as representatives of the N holding circuits $H_1$ to $H_N$. That is, a circuit portion relating to the pixel $P_{m,n}$ on the m-th row and the n-th column and the n-th column readout wiring line $L_{O,n}$ and a circuit portion relating to the pixel $P_{m,n+1}$ on the m-th row and the (n+1)-th column and the (n+1)-th column readout wiring line $L_{O,n+1}$ are shown.

The pixels $P_{m,n}$ and $P_{m,n+1}$ include photodiodes PD and readout switches $SW_1$. The anode terminals of the photodiodes PD are grounded, and the cathode terminals are connected with the corresponding readout wiring lines $L_{O,n}$ and $L_{O,n+1}$, respectively, via the readout switches $SW_1$. Each photodiode PD generates charge of an amount according to an incident light intensity, and accumulates the generated charge in a junction capacitance section. Each readout switch $SW_1$ is provided with an m-th row selection control signal Vsel(m) via the m-th row selection wiring line $L_{V,m}$ from the vertical shift register section 40a or 40b. The m-th row selection control signal Vsel(m) instructs an opening and closing operation of the readout switch $SW_1$ in each of the N pixels $P_{m,1}$ to $P_{m,N}$ of the m-th row in the photodetecting section 10.

In these pixels $P_{m,n}$ and $P_{m,n+1}$, when the m-th row selection control signal Vsel(m) has a non-significant value (for example, low level), the readout switches $SW_1$ open. At this time, charges generated in the photodiodes PD are not output to the column readout wiring lines $L_{O,n}$ and $L_{O,n+1}$, respectively, but are accumulated in the junction capacitance sections. On the other hand, when the m-th row selection control signal Vsel(m) has a significant value (for example, high level), the readout switches $SW_1$ close. At this time, the charges generated in the photodiodes PD and accumulated in the junction capacitance sections until then are output to the readout wiring lines $L_{O,n}$ and $L_{O,n+1}$, respectively, through the readout switches $SW_1$.

In the circuits shown in FIG. 6, one readout wiring line $L_{O,n+1}$ of the two readout wiring lines $L_{O,n}$ and $L_{O,n+1}$ is connected with a horizontal binning changeover switch $SW_4$. The horizontal binning changeover switch $SW_4$ is provided with a horizontal binning control signal Hbin via the horizontal binning changeover wiring line $L_B$ from the controlling section 6. The horizontal binning control signal Hbin instructs a switching operation of the N/2 horizontal binning changeover switches $SW_4$.

The horizontal binning changeover switch $SW_4$, when the horizontal binning control signal Hbin has a non-significant value (for example, low level), connects the readout wiring line $L_{O,n+1}$ and the integration circuit $S_{n+1}$. At this time, a charge flowing through the readout wiring line $L_{O,n+1}$ is output to the integration circuit $S_{n+1}$, and a charge flowing through the readout wiring line $L_{O,n}$ is output to the integration circuit $S_n$ (normal operation mode). On the other hand, the horizontal binning changeover switch $SW_4$, when the horizontal binning control signal Hbin has a significant value (for example, high level), connects the readout wiring line $L_{O,n+1}$ and the integration circuit $S_n$. At this time, a charge flowing through the readout wiring line $L_{O,n+1}$ is output to the integration circuit $S_n$ together with a charge flowing through the readout wiring line $L_{O,n}$ (binning operation mode).

The integration circuits $S_n$ and $S_{n+1}$ include amplifiers $A_2$, integrating capacitive elements $C_{21}$ serving as feedback capacitance sections, and discharge switches $SW_{21}$. Each integrating capacitive element $C_{21}$ and each discharge switch $SW_{21}$ are connected in parallel with each other, and provided between an input terminal and an output terminal of each amplifier $A_2$. The input terminals of the amplifiers $A_2$ are connected with the corresponding readout wiring lines $L_{O,n}$ and $L_{O,n+1}$, respectively.

Each discharge switch $SW_{21}$ is provided with a reset control signal Reset via the reset wiring line $L_R$ from the controlling section 6. The reset control signal Reset instructs an opening and closing operation of the discharge switch $SW_{21}$ in each of the N integration circuits $S_1$ to $S_N$.

In these integration circuits $S_n$ and $S_{n+1}$, when the reset control signal Reset has a non-significant value (for example, high level), the discharge switches $SW_{21}$ close, the feedback capacitance sections (integrating capacitive elements $C_{21}$) are discharged, and output voltage values are initialized. On the other hand, when the reset control signal Reset has a significant value (for example, low level), the discharge switches $SW_{21}$ open, charges input to the input terminals are accumulated in the feedback capacitance sections (integrating capacitive elements $C_{21}$), and voltage values according to the accumulated charge amounts are output from the integration circuits $S_n$ and $S_{n+1}$.

The holding circuits $H_n$ and $H_{n+1}$ include input switches $SW_{31}$, output switches $SW_{32}$, and holding capacitive elements $C_3$. One-side ends of the holding capacitive elements $C_3$ are grounded. The-other-side ends of the holding capacitive elements $C_3$ are connected to the output terminals of the corresponding integration circuits $S_n$ and $S_{n+1}$ via the input switches $SW_{31}$, and connected with the voltage output wiring line $L_{out}$ via the output switches $SW_{32}$. Each input switch $SW_{31}$ is provided with a hold control signal Hold via the hold wiring line $L_H$ from the controlling section 6. The hold control signal Hold instructs an opening and closing operation of the input switch $SW_{31}$ in each of the N holding circuits $H_1$ to $H_N$. The output switch $SW_{32}$ of the holding circuit $H_n$ is provided with an n-th column selection control signal Hshift(n) passed through the n-th column selection wiring line $L_{S,n}$ from the controlling section 6. Similarly, the output switch $SW_{32}$ of the holding circuit $H_{n+1}$ is provided with an (n+1)-th column selection control signal Hshift(n+1) passed through the (n+1)-th column selection wiring line $L_{s,n+1}$ from the controlling section 6. The selection control signals Hshift(1) to Hshift(N) instruct an opening and closing operation of the output switches $SW_{32}$ of the respective holding circuits $H_1$ to $H_N$.

In these holding circuits $H_n$ and $H_{n+1}$, when the hold control signal Hold switches, for example, from high level to low level, each input switch $SW_{31}$ switches from a closed state to an open state, and a voltage value being input to the input terminal at this time is held in each holding capacitive element $C_3$. Moreover, when the n-th column selection control signal Hshift(n) has a significant value (for example, high level), the output switch $SW_{32}$ of the holding circuit $H_n$ closes, and the voltage value held in the holding capacitive element $C_3$ of the holding circuit $H_n$ is output to the voltage output wiring line $L_{out}$. Moreover, when the (n+1)-th column selection control signal Hshift(n+1) has a significant value (for example, high level), the output switch $SW_{32}$ of the holding circuit $H_{n+1}$ closes, and the voltage value held in the holding capacitive element $C_3$ of the holding circuit $H_{n+1}$ is output to the voltage output wiring line $L_{out}$.

The controlling section 6, when outputting a voltage value according to a received light intensity in each of the N pixels $P_{m,1}$ to $P_{m,N}$ of the m-th row in the photodetecting section 10, instructs opening after closing for a predetermined period of the discharge switch $SW_{21}$ in each of the N integration circuits $S_1$ to $S_N$ by a reset control signal Reset, and then instructs opening after closing for a predetermined period of the readout switch $SW_1$ in each of the N pixels $P_{m,1}$ to $P_{m,N}$ of the m-th row in the photodetecting section 10 by an m-th row selection control signal Vsel(m).

After the readout switch $SW_1$ opens, the controlling section 6 instructs switching of the input switch $SW_{31}$ in each of the N holding circuits $H_1$ to $H_N$ from a closed state to an open state by a hold control signal Hold. Then, the controlling section 6 instructs sequential closing of the output switches $SW_{32}$ of the respective N holding circuits $H_1$ to $H_N$ for a given period by column selection control signals Hshift(1) to Hshift(N). The controlling section 6 performs such control as in the above for the respective rows in sequence.

Thus, the controlling section 6 controls an opening and closing operation of a readout switch $SW_1$ in each of the M×N pixels $P_{1,1}$ to $P_{M,N}$ in the photodetecting section 10, and controls a holding operation and an output operation of a voltage value in the signal connecting section 20. Accordingly, the controlling section 6 causes a voltage value according to the amount of charge generated in the photodiode PD of each of the M×N pixels $P_{1,1}$ to $P_{M,N}$ in the photodetecting section 10 to be repeatedly output as frame data from the signal connecting section 20.

Figure 7:
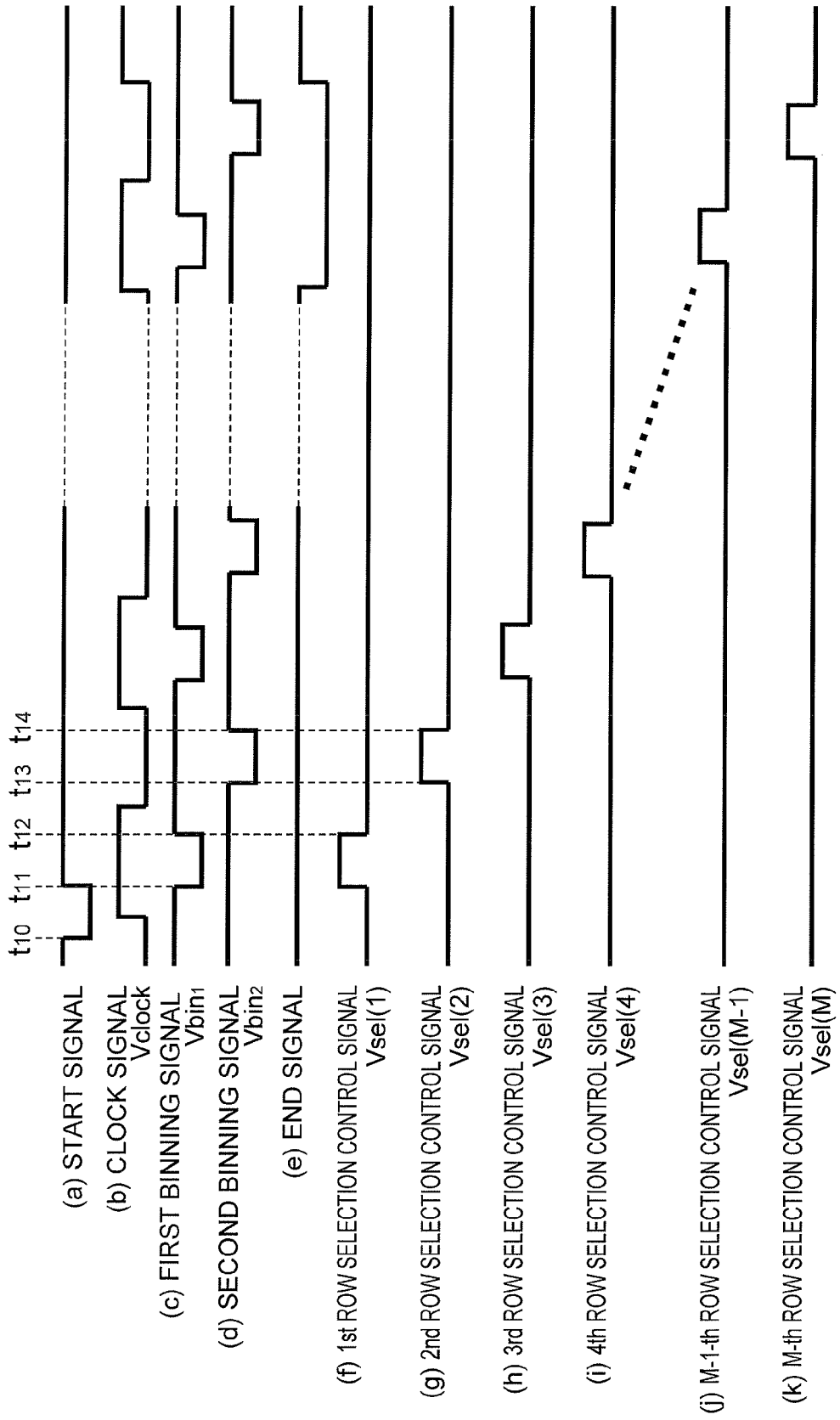
FIG. 7 is a timing chart for explaining a normal operation of the solid-state imaging device.
Figure 8:
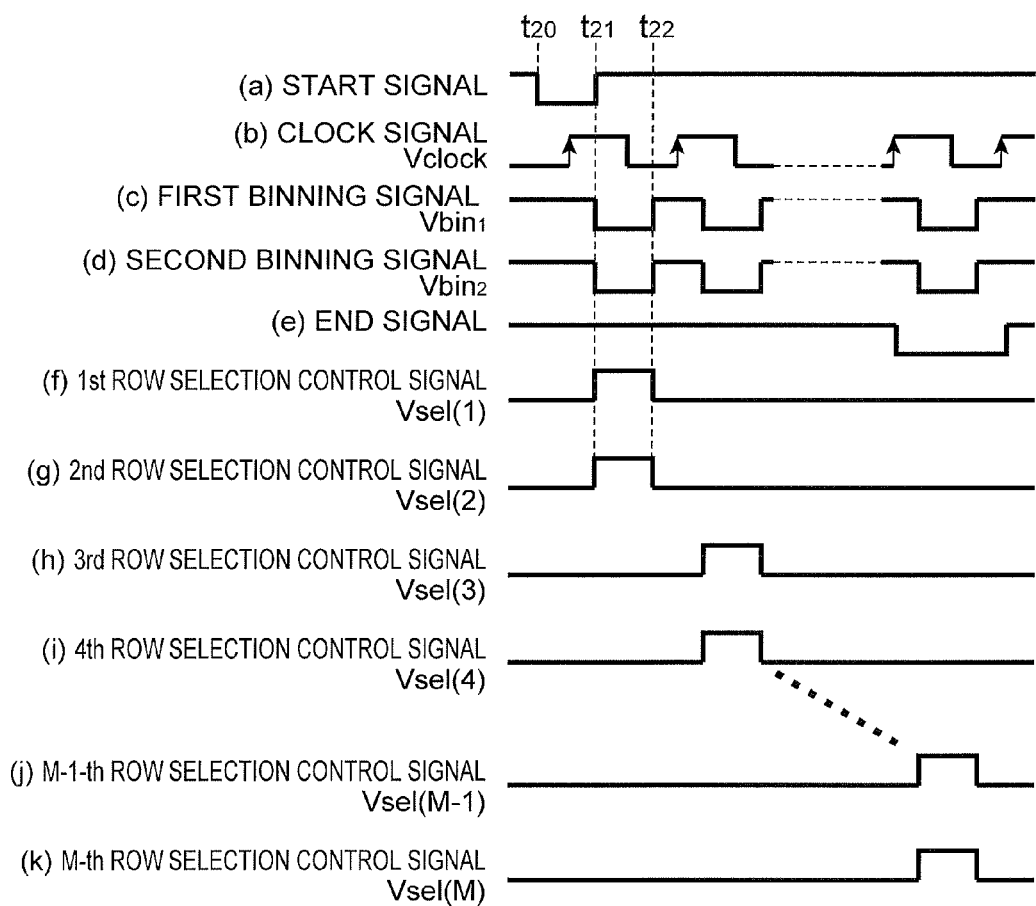
FIG. 8 is a timing chart for explaining a binning operation of the solid-state imaging device.

The operation of the solid-state imaging device 1 according to the present embodiment is as follows. FIG. 7 is a timing chart for explaining a normal operation of the solid-state imaging device 1 according to the present embodiment. Moreover, FIG. 8 is a timing chart for explaining a binning operation of the solid-state imaging device 1 according to the present embodiment. FIG. 7 and FIG. 8 show, in order from the top, (a) the start signal indicating the timing for stating output of frame data, (b) the clock signal Vclock, (c) the first binning signal $Vbin_1$, (d) the second binning signal $Vbin_2$, (e) the end signal indicating the timing for ending output of frame data, (0 the first row selection control signal Vsel(1), (g) the second row selection control signal Vsel(2), (h) the third row selection control signal Vsel(3), (i) the fourth row selection control signal Vsel(4), (j) the M−1-th row selection control signal Vsel(M−1), and (k) the M-th row selection control signal Vsel(M).

[Normal Operation Mode]

In the normal operation mode, charges generated in the photodiodes PD of the pixels $P_{1,1}$ to $P_{M,N}$ and accumulated in the junction capacitance sections are read out as follows. As shown in FIG. 7, before the time $t_{10}$, each of the start signal, the first binning signal, the second binning signal, and the end signal has a non-significant value (high level). Moreover, each of the M row selection control signals Vsel(1) to Vsel(M) has a non-significant value (low level).

During a period from the time $t_{10}$ to the time $t_{11}$, the start signal to be output from the controlling section 6 takes a significant value (low level). In this period, when the clock signal Vclock rises, the first binning signal $Vbin_1$ in response thereto takes a significant value (low level) for a period from the time $t_{11}$ to the time $t_{12}$. Moreover, in response to the rise of the clock signal Vclock, an output signal from the first-stage shift register circuit 43 takes a significant value (low level). Accordingly, the first row selection control signal Vsel(1) to be output from the logic circuit $LO_1$ to the first row selection wiring line $L_{V,1}$ takes a significant value (high level) for the period from the time $t_{11}$ to the time $t_{12}$, and the readout switch $SW_1$ in each of the N pixels $P_{1,1}$ to $P_{1,N}$ of the first row in the photodetecting section 10 reaches a connected state. Charges generated in the photodiodes PD of the respective N pixels $P_{1,1}$ to $P_{1,N}$ and accumulated in the junction capacitance sections are output to the integration circuits $S_1$ to $S_N$ through the readout switches $SW_1$ and the column readout wiring lines $L_{O,1}$ to $L_{O,N}$, and accumulated in the integrating capacitive elements $C_{21}$. From the integration circuits $S_1$ to $S_N$, voltages of the magnitudes according to the amounts of charges accumulated in the integrating capacitive elements $C_{21}$ are output.

And, as a result of the hold control signal Hold to be output to the hold wiring line $L_H$ from the controlling section 6 taking a significant value (high level), the input switches $SW_{31}$ of the N holding circuits $H_1$ to $H_N$ reach a connected state, and the magnitudes of voltages output from the integration circuits $S_1$ to $S_N$ are held by the holding circuits $H_1$ to $H_N$. Subsequently, the column selection control signals Hshift(1) to Hshift(N) to be output to the column selection wiring lines $L_{S,1}$ to $L_{S,N}$ from the horizontal shift register section 41 sequentially take significant values (high level) for a given period, and the output switches $SW_{32}$ of the respective N holding circuits $H_1$ to $H_N$ sequentially reach a connected state for the given period, so that the voltage values held in the holding capacitive elements $C_3$ of the respective holding circuits $H_1$ to $H_N$ are sequentially output to the voltage output wiring line $L_{out}$ through the output switches $SW_{32}$.

Then, the clock signal Vclock falls, and the second binning signal $Vbin_2$ in response thereto takes a significant value (low level) for a period from the time $t_{13}$ to the time $t_{14}$ after the time $t_{12}$. Moreover, the output signal from the first-stage shift register circuit 43 is maintained at a significant value (low level). Accordingly, the second row selection control signal Vsel(2) to be output from the logic circuit $LO_2$ to the second row selection wiring line $L_{V,2}$ takes a significant value (high level) for the period from the time $t_{13}$ to the time $t_{14}$, and the readout switch $SW_1$ in each of the N pixels $P_{2,1}$ to $P_{2,N}$ of the second row in the photodetecting section 10 reaches a connected state. Charges generated in the photodiodes PD of the respective N pixels $P_{2,1}$ to $P_{2,N}$ and accumulated in the junction capacitance sections are output to the integration circuits $S_1$ to $S_N$, and accumulated in the integrating capacitive elements $C_{21}$. Subsequently, by the same operation as the operation in the case of the first row, voltage values of the magnitudes according to these charges are sequentially output to the voltage output wiring line $L_{out}$.

In the normal operation mode, subsequent to the operation for the first row and the second row as in the above, the same operation is performed for the third row to the M-th row, so that frame data indicating an image captured in one time imaging is obtained. Also, when the operation ends with respect to the M-th row, the same operation is again performed in a range from the first row to the M-th row, and frame data indicating a next image is obtained.

[Binning Operation Mode]

In the binning operation mode, charges generated in the photodiodes PD of the pixels $P_{1,1}$ to $P_{M,N}$ and accumulated in the junction capacitance sections are read out as follows. As shown in FIG. 8, before the time $t_{20}$, each of the start signal, the first binning signal, the second binning signal, and the end signal has a non-significant value (high level). Moreover, each of the M row selection control signals Vsel(1) to Vsel(M) has a non-significant value (low level).

During a period from the time $t_{20}$ to the time $t_{21}$, the start signal to be output from the controlling section 6 takes a significant value (low level). In this period, when the clock signal Vclock rises, the first binning signal $Vbin_1$ and the second binning signal $Vbin_2$ in response thereto take significant values (low level) for a period from the time $t_{21}$ to the time $t_{22}$. Moreover, in response to the rise of the clock signal Vclock, an output signal from the first-stage shift register circuit 43 takes a significant value (low level). Accordingly, the first row selection control signal Vsel(1) to be output from the logic circuit $LO_1$ to the first row selection wiring line $L_{V,1}$ and the second row selection control signal Vsel(2) to be output from the logic circuit $LO_2$ to the second row selection wiring line $L_{V,2}$ take significant values (high level) for the period from the time $t_{21}$ to the time $t_{22}$, and the readout switches $SW_1$ in the N pixels $P_{1,1}$ to $P_{1,N}$ of the first row and the N pixels $P_{2,1}$ to $P_{2,N}$ of the second row in the photodetecting section 10 reach a connected state. Accordingly, charges generated in the photodiodes PD of the pixels $P_{1,1}$ to $P_{1,N}$ and $P_{2,1}$ to $P_{2,N}$ and accumulated in the junction capacitance sections are output to the column readout wiring lines $L_{O,1}$ to $L_{O,N}$ through the readout switches $SW_1$. Moreover, at this time, as a result of the horizontal binning control signal Hbin to be output to the horizontal binning changeover wiring line $L_B$ from the controlling section 6 taking a significant value (high level), the N/2 horizontal binning changeover switches $SW_4$ change over. Accordingly, charges output to two neighboring column readout wiring lines are both output to a single integration circuit S. For example, charges output to the column readout wiring lines $L_{O,1}$ and $L_{O,2}$ are both output to the integration circuit $S_1$. These charges are respectively accumulated in the integrating capacitive elements $C_{21}$ of the integration circuits $S_1$, $S_3$, ..., $S_{N-1}$. From the integration circuits $S_1$, $S_3$, ..., $S_{N-1}$/voltages of the magnitudes according to the amounts of charges accumulated in the integrating capacitive elements $C_{21}$ are output.

Subsequently, as a result of the hold control signal Hold taking a significant value (high level), the input switches $SW_{31}$ of the N holding circuits $H_1$ to $H_N$ reach a connected state, and the magnitudes of voltages output from the integration circuits $S_1$ to $S_N$ are held by the holding circuits $H_1$ to $H_N$. And, the column selection control signals Hshift(1), Hshift (3), ..., Hshift(N−1) sequentially take significant values (high level) for a given period, and the output switches $SW_{32}$ of respective N/2 holding circuits $H_1$, $H_3$, ..., $H_{N-1}$ sequentially reach a connected state for the given period, so that the voltage values held in the holding capacitive elements $C_3$ of the respective holding circuits $H_1$, $H_3$, ..., $H_{N-1}$ are sequentially output to the voltage output wiring line $L_{out}$ through the output switches $SW_{32}$.

In the binning operation mode, subsequent to the operation for the first row and the second row as in the above, the same operation is performed for the third row to the M-th row, so that frame data indicating an image captured in one time imaging is obtained. Also, when the operation ends with respect to the M-th row, the same operation is again performed in a range from the first row to the M-th row, and frame data indicating a next image is obtained.

By the solid-state imaging device 1 according to the present embodiment described in the above, the following effects are obtained. That is, by the solid-state imaging device 1, as a result of the vertical shift register sections 40a and 40b having the configuration shown in FIG. 5, both the normal operation and binning operation can be favorably realized. Moreover, because the shift register circuits 43 of the vertical shift register sections 40a, 40b are provided for every two row selection wiring lines, the vertical shift register sections 40a, 40b can be made smaller than that of a conventional solid-state imaging device for which shift register circuits are disposed for each row. Particularly, in the solid-state imaging device 1 of the present embodiment, because the shift register circuits 43 are formed of a semiconductor material containing polycrystalline silicon, such an effect is more remarkable.

Moreover, as in the present embodiment, each of the M row selection wiring lines $L_{V,1}$ to $L_{V,M}$ may be constructed by a single wiring line extending from the first column to the N-th column. In this case, it is preferable that each of the vertical shift register sections 40a and 40b provides a row selection control signal Vsel to each of both ends of the M row selection wiring lines $L_{V,1}$ to $L_{V,M}$. Thus, as a result of the vertical shift register sections 40a and 40b being provided at both ends of the respective row selection wiring lines $L_{V,1}$ to $L_{V,M}$, even when any of the M row selection wiring lines $L_{V,1}$ to $L_{V,M}$ is disconnected, the range of pixels to be inoperative can be reduced, and the occurrence of a large-scale line defect can be suppressed.

(Modification)

Figure 9:
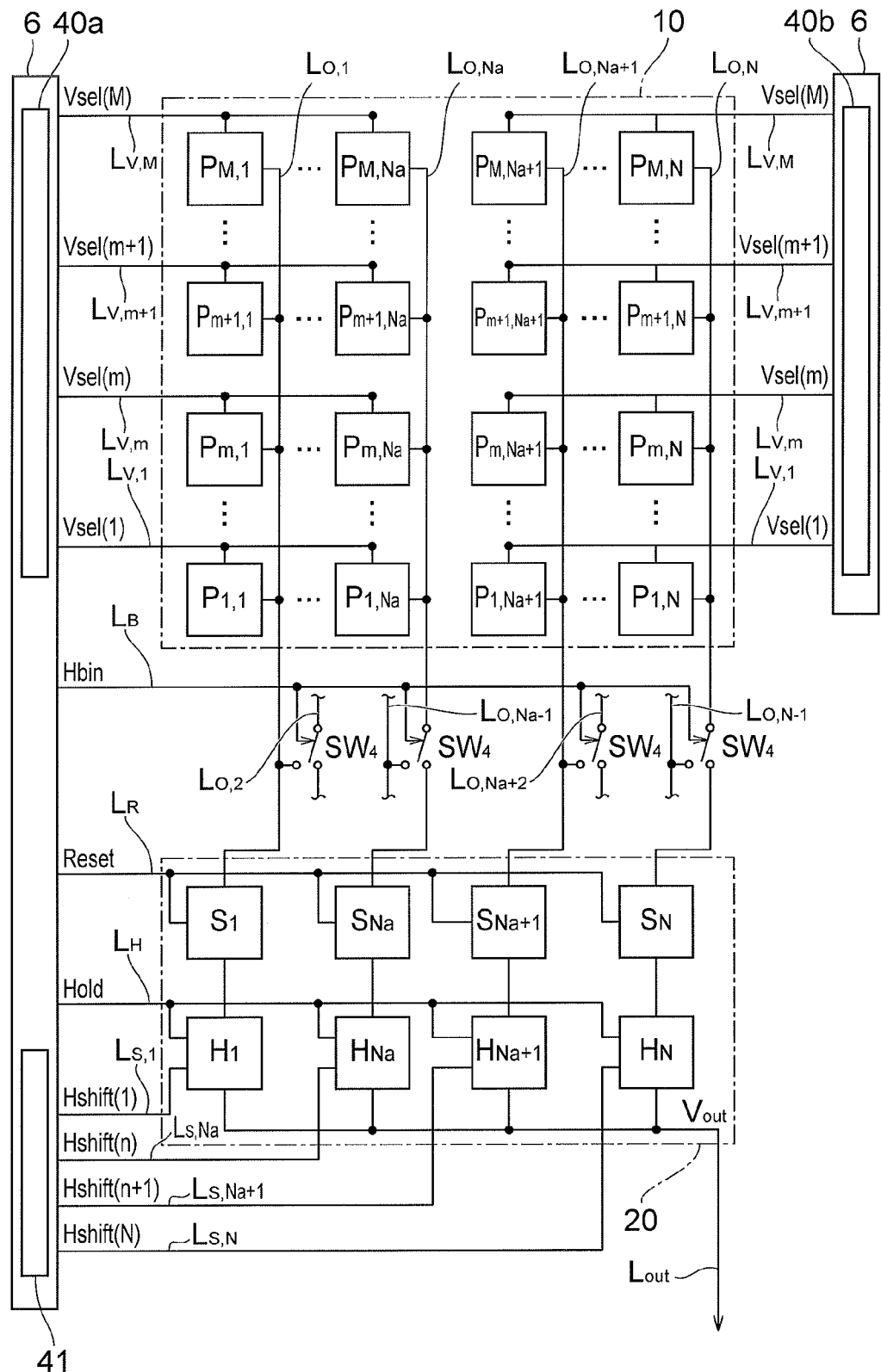
FIG. 9 is a diagram showing another example of the internal configuration of the solid-state imaging device.

Next, a modification of the above-mentioned embodiment will be described. FIG. 9 is a diagram showing the internal configuration of a solid-state imaging device of the present modification. The difference in configuration between the present modification and the above-mentioned embodiment is in the configuration of row selection wiring lines. In the present modification, each of the M row selection wiring lines $L_{V,1}$ to $L_{V,M}$ has a first part extending from the pixel $P_{m,1}$ to the pixel $P_{m,Na}$ (provided that Na is an integer not less than 2 and not more than N−1) and a second part extending from the pixel $P_{m,Na+1}$ to the pixel $P_{m,N}$, and these parts are electrically separated from each other And, one part (pixels $P_{m,1}$ to $P_{m,Na}$) of the N pixels $P_{m,1}$ to $P_{m,N}$ of the m-th row is connected to one vertical shift register section 40a via the first part of the m-th row selection wiring line $L_{V,m}$. The other part (pixels $P_{m,Na+1}$ to $P_{m,N}$) of the N pixels $P_{m,1}$ to $P_{m,N}$ of the m-th row is connected to the other vertical shift register section 40b via the second part of the m-th row selection wiring line $L_{V,m}$. Also, in FIG. 9, the two vertical shift register sections 40a and 40b are both included in the controlling section 6.

The vertical shift register section 40a of the controlling section 6 outputs an m-th row selection control signal Vsel(m) to the m-th row selection wiring line $L_{V,m}$ to provide this m-th row selection control signal Vsel(m) to each of the Na pixels $P_{m,1}$ to $P_{m,Na}$ of the m-th row. Similarly, the vertical shift register section 40b outputs an m-th row selection control signal Vsel(m) to the m-th row selection wiring line $L_{V,m}$ to provide this m-th row selection control signal Vsel(m) to each of the (N−Na) pixels $P_{m,Na+1}$ to $P_{m,N}$ of the m-th row. In each of the vertical shift register sections 40a and 40b, M row selection control signals Vsel(1) to Vsel(M) sequentially take significant values.

According to the configuration of the present modification, a delay in the row selection control signals Vsel(1) to Vsel(M) to be provided for the large-area photodetecting section 10 can be effectively suppressed.

The solid-state imaging device by the present invention is not limited to the embodiments described above, and various other modifications can be made. For example, in the above-mentioned embodiment, description has been given of an example in which the present invention is applied to a solid-state imaging device formed by film-forming of polycrystalline silicon or amorphous silicon on a glass substrate, but the present invention is not limited to such a configuration, and can also be applied to, for example, a solid-state imaging element that is fabricated on a monocrystalline silicon substrate.

The solid-state imaging device of the above-mentioned embodiment includes a light receiving section consisting of M×N (M is an even number not less than 2, N is an integer not less than 2) pixels each including a photodiode and a readout switch connected at one end to the photodiode that are arrayed two-dimensionally in M rows and N columns, M row selection wiring lines arranged for each row, and connected to control terminals of the readout switches included in the pixels of corresponding rows, and a vertical shift register section for providing row selection control signals for controlling opening and closing of the readout switches to the M row selection wiring lines, the vertical shift register section includes a shift register array including M/2 shift register circuits formed of a semiconductor material containing polycrystalline silicon, and disposed for every two row selection wiring lines, M logic circuits for outputting the row selection control signals respectively to the M row selection wiring lines, a first binning selection wiring line for providing one-side input terminals of M/2 logic circuits connected to one of each two row selection wiring lines with a first binning control signal for selecting the one row selection wiring line, and a second binning selection wiring line for providing one-side input terminals of M/2 logic circuits connected to the other of each two row selection wiring lines with a second binning control signal for selecting the other row selection wiring line, and the device is arranged such that, to the-other-side input terminal of each of the M logic circuits, an output terminal of the shift register circuit corresponding to the row selection wiring line connected to the logic circuit is connected, each of the M logic circuits, when the first binning control signal or the second binning control signal and an output signal from the shift register circuit both have significant values, outputs the row selection control signal so as to close the readout switch, and the vertical shift register section has a normal operation mode for successively selecting the two row selection wiring lines and a binning operation mode for simultaneously selecting the two row selection wiring lines, by controlling the timing at which the first binning control signal and the second binning control signal take significant values.

Moreover, the solid-state imaging device may be arranged such that each of the M row selection wiring lines is constructed by a single wiring line extending from the first column to the N-th column, and the solid-state imaging device includes a first vertical shift register section for providing the row selection control signals to one-side ends of the M row selection wiring lines, and a second vertical shift register section for providing the row selection control signals to the-other-side ends of the M row selection wiring lines. Thus, as a result of the vertical shift register sections being provided at both ends of the respective row selection wiring lines, even when any of the M row selection wiring lines is disconnected, the range of pixels to be inoperative can be reduced, and the occurrence of a large-scale line defect can be suppressed.

Moreover, the solid-state imaging device may be arranged such that the M row selection wiring lines include first parts connected to control terminals of the readout switches included in the pixels of the first column through the Na-th column (Na is an integer not less than 2 and not more than N−1) out of the N columns and second parts connected to control terminals of the readout switches included in the pixels of the (Na+1)-th column through the N-th column out of the N columns, and the solid-state imaging device includes a first vertical shift register section for providing the row selection control signals to the first parts of the M row selection wiring lines, and a second vertical shift register section for providing the row selection control signals to the second parts of the M row selection wiring lines. Accordingly, a delay in the row selection control signals to be provided for the large-area photodetecting section can be suppressed.

INDUSTRIAL APPLICABILITY

The present invention can be applied as a solid-state imaging device which allows realizing a vertical binning operation by a small vertical shift register.

REFERENCE SIGNS LIST

1—solid-state imaging device, 6—controlling section, 10—photodetecting section, 20—signal connecting section, 40a, 40b—vertical shift register section, 43—shift register circuit, 45—first binning selection wiring line, 46—second binning selection wiring line, PD—photodiode, P—pixel, $SW_1$—readout switch, $SW_{31}$—input switch, $SW_{32}$—output switch, $SW_4$—horizontal binning changeover switch, $S_1$ to $S_N$—integration circuit, $H_1$ to $H_N$—holding circuit, $C_{21}$—integrating capacitive element, $A_2$—amplifier, $L_B$—horizontal binning changeover wiring line, $L_{O,1}$ to $L_{O,N}$—column readout wiring line, $L_{V,1}$ to $L_{V,M}$—row selection wiring line.

The invention claimed is:

1. A solid-state imaging device comprising:
a photodetecting section having M×N (M is an even number not less than 2, N is an integer not less than 2) pixels each including a photodiode and a readout switch connected at one end to the photodiode that are arrayed two-dimensionally in M rows and N columns;
M row selection wiring lines arranged for each row, and connected to control terminals of the readout switches included in the pixels of corresponding rows;
N readout wiring lines connected to the other ends of the readout switches included in the pixels of corresponding columns and reading out charges from the photodiodes; and
a vertical shift register section for providing row selection control signals for controlling opening and closing of the readout switches to the M row selection wiring lines,
the vertical shift register section including:
a shift register array including M/2 shift register circuits formed of a semiconductor material containing polycrystalline silicon, and disposed for every two adjacent row selection wiring lines provided for two adjacent rows;
M logic circuits for outputting the row selection control signals respectively to the M row selection wiring lines;
a first binning selection wiring line for providing one-side input terminals of M/2 logic circuits connected to one of each two adjacent row selection wiring lines with a first binning control signal for selecting the one row selection wiring line; and
a second binning selection wiring line for providing one-side input terminals of M/2 logic circuits connected to the other of each two adjacent row selection wiring lines with a second binning control signal for selecting the other row selection wiring line, wherein
to the other-side input terminal of each of the M logic circuits, an output terminal of the shift register circuit corresponding to the row selection wiring line connected to the logic circuit is connected,
each of the M logic circuits, when the first binning control signal or the second binning control signal and an output signal from the shift register circuit both have significant values, outputs the row selection control signal so as to close the readout switch, and
the vertical shift register section has a normal operation mode for successively selecting the two adjacent row selection wiring lines and a binning operation mode for simultaneously selecting the two adjacent row selection wiring lines, by controlling the timings at which the first binning control signal and the second binning control signal take significant values.

2. The solid-state imaging device according to claim 1, wherein
each of the M row selection wiring lines is constructed by a single wiring line extending from the first column to the N-th column, and
the solid-state imaging device comprises a first vertical shift register section and a second vertical shift register section as the vertical shift register section,
the first vertical shift register section provides the row selection control signals to one-side ends of the M row selection wiring lines; and
the second vertical shift register section provides the row selection control signals to the other-side ends of the M row selection wiring lines.

3. The solid-state imaging device according to claim 1, wherein the M row selection wiring lines include first parts connected to control terminals of the readout switches included in the pixels of the first column through the Na-th column (Na is an integer not less than 2 and not more than N−1) out of the N columns and second parts connected to control terminals of the readout switches included in the pixels of the (Na+1)-th column through the N-th column out of the N columns, and the solid-state imaging device comprises a first vertical shift register section and a second vertical shift register section as the vertical shift register section, the first vertical shift register section provides the row selection control signals to the first parts of the M row selection wiring lines; and the second vertical shift register section provides the row selection control signals to the second parts of the M row selection wiring lines.

4. A solid-state imaging device comprising:

a photodetecting section having M×N (M is an even number not less than 2, N is an integer not less than 2) pixels each including a photodiode and a readout switch connected at one end to the photodiode that are arrayed two-dimensionally in M rows and N columns;

M row selection wiring lines arranged for each row, and connected to control terminals of the readout switches included in the pixels of corresponding rows;

N readout wiring lines connected to the other ends of the readout switches included in the pixels of corresponding columns, and reading out charges from the photodiodes; and a vertical shift register section for providing row selection control signals for controlling opening and closing of the readout switches to the M row selection wiring lines, the vertical shift register section including:

a shift register array including M/2 shift register circuits formed of a semiconductor material, and disposed for every two adjacent row selection wiring lines provided for two adjacent rows;

M logic circuits for outputting the row selection control signals respectively to the M row selection wiring lines;

a first binning selection wiring line for providing one-side input terminals of M/2 logic circuits connected to one of each two adjacent row selection wiring lines with a first binning control signal for selecting the one row selection wiring line; and a second binning selection wiring line for providing one-side input terminals of M/2 logic circuits connected to the other of each two adjacent row selection wiring lines with a second binning control signal for selecting the other row selection wiring line, wherein to the other-side input terminal of each of the M logic circuits, an output terminal of the shift register circuit corresponding to the row selection wiring line connected to the logic circuit is connected, each of the M logic circuits, when the first binning control signal or the second binning control signal and an output signal from the shift register circuit both have significant values, outputs the row selection control signal so as to close the readout switch, and the vertical shift register section has a normal operation mode for successively selecting the two adjacent row selection wiring lines and a binning operation mode for simultaneously selecting the two adjacent row selection wiring lines, by controlling the timings at which the first binning control signal and the second binning control signal take significant values.

* * * * *